United States Patent
Cao et al.

(10) Patent No.: US 10,355,687 B2
(45) Date of Patent: Jul. 16, 2019

(54) WAVE LOSS DETECTION CIRCUIT FOR DRIVE SIGNAL AND SWITCHING TRANSISTOR DRIVE CIRCUIT

(71) Applicant: HUAWEI TECHNOLOGIES CO., LTD., Shenzhen (CN)

(72) Inventors: Zhen Cao, Shanghai (CN); Yunfeng Liu, Shanghai (CN); Yanzhong Zhang, Kista (SE)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 87 days.

(21) Appl. No.: 15/354,488

(22) Filed: Nov. 17, 2016

(65) Prior Publication Data

US 2017/0070224 A1  Mar. 9, 2017

Related U.S. Application Data

(63) Continuation of application No. PCT/CN2014/093254, filed on Dec. 8, 2014.

(30) Foreign Application Priority Data

May 19, 2014  (CN) .......................... 2014 1 0211063

(51) Int. Cl.
*G01R 19/00*  (2006.01)
*H03K 5/19*  (2006.01)
(Continued)

(52) U.S. Cl.
CPC ......... *H03K 17/567* (2013.01); *G01R 31/026* (2013.01); *G01R 31/44* (2013.01);
(Continued)

(58) Field of Classification Search
CPC .... H03K 17/567; H03K 17/18; H03K 17/162; H03K 17/122; H03K 17/08122;
(Continued)

(56) References Cited

U.S. PATENT DOCUMENTS

| 5,020,024 A | 5/1991 | Williams |
| 5,351,162 A | 9/1994 | Koishikawa |

(Continued)

FOREIGN PATENT DOCUMENTS

| CN | 1487657 A | 4/2004 |
| CN | 200957489 Y | 10/2007 |

(Continued)

OTHER PUBLICATIONS

International Search Report (including English translation) issued in corresponding International Application No. PCT/CN2014/093254, dated Feb. 11, 2015, 8 pages.

(Continued)

*Primary Examiner* — Metasebia T Retebo
(74) *Attorney, Agent, or Firm* — Conley Rose, P.C.

(57) ABSTRACT

A wave loss detection circuit includes: an anode of the diode receives a first drive signal, and a cathode of the diode is connected to a first end of the first resistor; a second end of the first resistor is connected to a first end of the first energy storage unit, a first end of the second resistor, and a first input end of the comparison unit; a second end of the first energy storage unit and a second end of the second resistor are connected to a ground level, and a resistance of the first resistor is less than a resistance of the second resistor; a second input end of the comparison unit is configured to receive a threshold voltage, and if a voltage signal received by the first input end is less than the threshold voltage, which indicates that a wave loss occurs in the first drive signal.

3 Claims, 4 Drawing Sheets

(51) Int. Cl.
    *H03K 17/567*     (2006.01)
    *H03B 28/00*     (2006.01)
    *H03K 4/08*     (2006.01)
    *H03K 7/08*     (2006.01)
    *G01R 31/02*     (2006.01)
    *H03K 17/0812*     (2006.01)
    *H03K 17/12*     (2006.01)
    *H03K 17/16*     (2006.01)
    *H03K 17/18*     (2006.01)
    *G01R 31/44*     (2006.01)

(52) U.S. Cl.
    CPC .............. *H03B 28/00* (2013.01); *H03K 4/085* (2013.01); *H03K 7/08* (2013.01); *H03K 17/08122* (2013.01); *H03K 17/122* (2013.01); *H03K 17/162* (2013.01); *H03K 17/18* (2013.01)

(58) Field of Classification Search
    CPC ........ H03K 7/08; H03K 4/085; G01R 31/026; H03B 28/00
    USPC ............................................................ 327/18
    See application file for complete search history.

(56) References Cited

U.S. PATENT DOCUMENTS

| | | | |
|---|---|---|---|
| 6,574,124 B2 * | 6/2003 | Lin | .................... H02M 3/1584 363/65 |
| 2006/0290334 A1 | 12/2006 | Bazes | |
| 2010/0231270 A1 | 9/2010 | Sasaki | |
| 2011/0234255 A1 | 9/2011 | Chobot | |
| 2011/0285424 A1 | 11/2011 | Suzuki et al. | |

FOREIGN PATENT DOCUMENTS

| | | |
|---|---|---|
| CN | 101829834 A | 9/2010 |
| CN | 103280774 A | 9/2013 |
| CN | 103997327 A | 8/2014 |
| EP | 0517261 A2 | 12/1992 |
| WO | 8805572 A2 | 7/1988 |

OTHER PUBLICATIONS

Office Action (including English translation) issued in corresponding Chinese Patent Application No. 201410211063.1, dated Jun. 13, 2016, 10 pages.

Extended European Search Report issued in corresponding EP Application No. 14892449, dated Apr. 28, 2017, 10 pages.

* cited by examiner

WAVE LOSS DETECTION CIRCUIT FOR DRIVE SIGNAL AND SWITCHING TRANSISTOR DRIVE CIRCUIT

CROSS-REFERENCE TO RELATED APPLICATIONS

This application is a continuation of International Application No. PCT/CN2014/093254, filed on Dec. 8, 2014, which claims priority to Chinese Patent Application No. 201410211063.1, filed on May 19, 2014, The disclosures of the aforementioned applications are hereby incorporated by reference in their entireties.

TECHNICAL FIELD

The present disclosure relates to the electronic control field, and in particular, to a wave loss detection circuit for a drive signal and a switching transistor drive circuit.

BACKGROUND

A drive signal is generally transmitted to a control end of an electronic device by using a transmission line, and is used to drive the electronic device to work.

However, because of a transmission line failure or the like, a wave loss phenomenon may occur in the drive signal, and the electronic device cannot be properly driven, which causes a security threat. For example, when IGBTs (Insulated Gate Bipolar Transistor) connected in parallel are being driven by using two drive signals, if a wave loss phenomenon occurs in one of the drive signals, the IGBT driven by the other drive signal bears a higher current; therefore, it is very likely that the device is overstressed and fails.

To eliminate this security threat, in the prior art, an output signal of an electronic device is detected by using a sensor, so as to determine, according to whether the electronic device properly works, whether a wave loss phenomenon occurs in a drive signal. However, generally, a price of a sensor is relatively high; therefore, costs are relatively high in this manner of detection by using a sensor.

SUMMARY

A technical problem to be resolved in the present disclosure is to provide a wave loss detection circuit for a drive signal and a switching transistor drive circuit, so as to reduce detection costs for detecting whether a wave loss occurs in a drive signal.

In view of this, technical solutions of the present disclosure for resolving the technical problems are as follows:

According to a first aspect, the present disclosure provides a wave loss detection circuit for a drive signal, including: a diode, a first resistor, a first energy storage unit, a second resistor, and a comparison unit. An anode of the diode is configured to receive a first drive signal, and a cathode of the diode is connected to a first end of the first resistor. A second end of the first resistor is connected to a first end of the first energy storage unit, a first end of the second resistor, and a first input end of the comparison unit. A second end of the first energy storage unit and a second end of the second resistor are connected to a ground level, and a resistance of the first resistor is less than a resistance of the second resistor, so that a charging speed of the first energy storage unit is greater than a discharging speed of the first energy storage unit. A second input end of the comparison unit is configured to receive a threshold voltage, and if a voltage signal received by the first input end is less than the threshold voltage, an output end of the comparison unit outputs a first voltage signal, where the first voltage signal indicates that a wave loss occurs in the first drive signal. The threshold voltage is a critical voltage of the first drive signal at a high level.

In a first possible implementation manner of the first aspect, the resistance of the first resistor is greater than a resistance of a threshold resistor, and when the resistance of the first resistor is equal to the resistance of the threshold resistor, an inrush current passing through the first energy storage unit is equal to a maximum allowable inrush current of the first energy storage unit.

With reference to the first aspect or the first possible implementation manner of the first aspect, in a second possible implementation manner of the first aspect, the drive signal is specifically any signal of a PWM drive signal, a triangular-wave drive signal, and a sine-wave drive signal.

According to a second aspect, the present disclosure provides a switching transistor drive circuit, and the drive circuit includes the wave loss detection circuit according to any one of the first aspect, the first possible implementation manner of the first aspect, and the second possible implementation manner of the first aspect in the embodiments of the present disclosure, a first drive signal generation circuit, a first controller, and a switching transistor. An output end of the first drive signal generation circuit is connected to an input end of the wave loss detection circuit and a control end of the switching transistor, and is configured to output a first drive signal to an anode of a diode and the control end of the switching transistor. An input end of the first controller is connected to an output end of the wave loss detection circuit, and an output end of the first controller is connected to an input end of the first drive signal generation circuit. When detecting that the output end of the wave loss detection circuit does not output a first voltage signal, the first controller controls the first drive signal generation circuit to generate and output the first drive signal, so as to drive the switching transistor. When detecting that the output end of the wave loss detection circuit outputs a first voltage signal, the first controller controls the first drive signal generation circuit to stop generating and outputting the first drive signal, so as to stop driving the switching transistor, or controls the first drive signal generation circuit to generate and output a second drive signal, so that the switching transistor is driven, and a current that passes through the switching transistor does not exceed a maximum current allowed by the switching transistor to pass through, where a pulse width of the second drive signal is less than a pulse width of the first drive signal.

According to a third aspect, the present disclosure provides a wave loss detection circuit for a drive signal, including: a first OR gate, a third resistor, and a second energy storage unit. Two input ends of the first OR gate are respectively configured to receive a first drive signal and a second drive signal that are complementary to each other. An output end of the first OR gate is connected to a first end of the third resistor, and a second end of the third resistor is connected to a first end of the second energy storage unit. A second end of the second energy storage unit is connected to a ground level. When the first end of the second energy storage unit outputs a low-level signal, it indicates that a wave loss occurs in at least one drive signal of the first drive signal and the second drive signal.

In a first possible implementation manner of the third aspect, each of the first drive signal and the second drive signal is specifically any signal of a PWM drive signal, a triangular-wave drive signal, and a sine-wave drive signal.

According to a fourth aspect, the present disclosure provides a switching transistor drive circuit, and the drive circuit includes the wave loss detection circuit according to the third aspect or the first possible implementation manner of the third aspect in the embodiments of the present disclosure, a second drive signal generation circuit, a second controller, and two switching transistors. Two output ends of the second drive signal generation circuit are connected to two input ends of the wave loss detection circuit and control ends of the two switching transistors, and are configured to: respectively output a first drive signal and a second drive signal to two input ends of a first OR gate, and respectively output the first drive signal and the second drive signal to the control ends of the two switching transistors. An input end of the second controller is connected to an output end of the wave loss detection circuit, and an output end of the second controller is connected to an input end of the second drive signal generation circuit. When detecting that the output end of the wave loss detection circuit outputs a high-level signal, the second controller controls the second drive signal generation circuit to generate and output the first drive signal and the second drive signal, so as to drive the two switching transistors. When detecting that the output end of the wave loss detection circuit outputs a low-level signal, the second controller controls the second drive signal generation circuit to stop generating and outputting the first drive signal and the second drive signal, so as to stop driving the two switching transistors, or controls the second drive signal generation circuit to generate and output a fifth drive signal and a sixth drive signal, so that the two switching transistors are respectively driven, and currents that pass through the two switching transistors do not exceed maximum currents allowed by the two switching transistors to pass through. A pulse width of the fifth drive signal is less than a pulse width of the first drive signal, and a pulse width of the sixth drive signal is less than a pulse width of the second drive signal; the fifth drive signal and the first drive signal are corresponding to driving of a same switching transistor, and the sixth drive signal and the second drive signal are corresponding to driving of a same switching transistor.

According to a fifth aspect, the present disclosure provides a wave loss detection circuit for a drive signal, including: a first OR gate, a second OR gate, a third resistor, a fourth resistor, a second energy storage unit, a third energy storage unit, and an AND gate. Two input ends of the first OR gate are respectively configured to receive a first drive signal and a second drive signal that are complementary to each other. An output end of the first OR gate is connected to a first end of the third resistor, and a second end of the third resistor is connected to a first end of the second energy storage unit. A second end of the second energy storage unit is connected to a ground level. Two input ends of the second OR gate are respectively configured to receive a third drive signal and a fourth drive signal that are complementary to each other. An output end of the second OR gate is connected to a first end of the fourth resistor, and a second end of the fourth resistor is connected to a first end of the third energy storage unit. A second end of the third energy storage unit is connected to the ground level. The second end of the third resistor and the second end of the fourth resistor are respectively connected to two input ends of the AND gate. When an output end of the AND gate outputs a low-level signal, it indicates that a wave loss occurs in at least one drive signal of the first drive signal, the second drive signal, the third drive signal, and the fourth drive signal.

According to a sixth aspect, the present disclosure provides a switching transistor drive circuit, and the drive circuit includes the wave loss detection circuit according to the fifth aspect in the embodiments of the present disclosure, a third drive signal generation circuit, a third controller, and four switching transistors. Four output ends of the third drive signal generation circuit are connected to four input ends of the wave loss detection circuit and control ends of the four switching transistors, and are configured to: respectively output a first drive signal, a second drive signal, a third drive signal, and a fourth drive signal to two input ends of a first OR gate and two input ends of a second OR gate, and respectively output the first drive signal, the second drive signal, the third drive signal, and the fourth drive signal to the control ends of the four switching transistors. An input end of the third controller is connected to an output end of the wave loss detection circuit, and an output end of the third controller is connected to an input end of the third drive signal generation circuit. When detecting that the output end of the wave loss detection circuit outputs a high-level signal, the third controller controls the third drive signal generation circuit to generate and output the first drive signal, the second drive signal, the third drive signal, and the fourth drive signal, so as to drive the four switching transistors. When detecting that the output end of the wave loss detection circuit outputs a low-level signal, the third controller controls the third drive signal generation circuit to stop generating and outputting the first drive signal, the second drive signal, the third drive signal, and the fourth drive signal, so as to stop driving the four switching transistors, or controls the third drive signal generation circuit to generate and output a fifth drive signal, a sixth drive signal, a seventh drive signal, and an eighth drive signal, so that the four switching transistors are respectively driven, and currents that pass through the four switching transistors do not exceed maximum currents allowed by the four switching transistors to pass through. A pulse width of the fifth drive signal is less than a pulse width of the first drive signal, a pulse width of the sixth drive signal is less than a pulse width of the second drive signal, a pulse width of the seventh drive signal is less than a pulse width of the third drive signal, and a pulse width of the eighth drive signal is less than a pulse width of the fourth drive signal; the fifth drive signal and the first drive signal are corresponding to driving of a same switching transistor, the sixth drive signal and the second drive signal are corresponding to driving of a same switching transistor, the seventh drive signal and the third drive signal are corresponding to driving of a same switching transistor, and the eighth drive signal and the fourth drive signal are corresponding to driving of a same switching transistor.

BRIEF DESCRIPTION OF DRAWINGS

To describe the technical solutions in the embodiments of the present application more clearly, the following briefly introduces the accompanying drawings required for describing the embodiments. Apparently, the accompanying drawings in the following description show merely some embodiments of the present application, and persons of ordinary skill in the art may still derive other drawings from these accompanying drawings without creative efforts.

DESCRIPTION OF EMBODIMENTS

Figure 1:
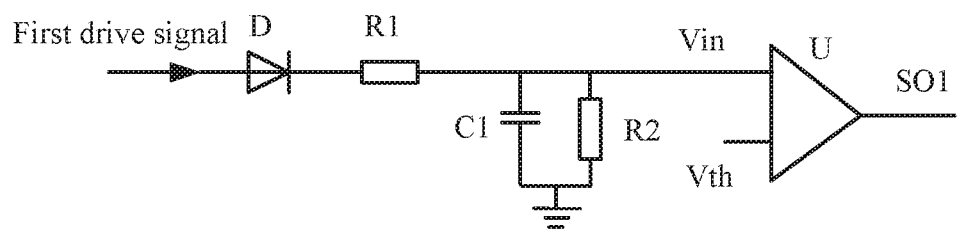
FIG. 1 is a specific circuit diagram of a first embodiment of a wave loss detection circuit according to an embodiment of the present disclosure.

It may be learned from the foregoing technical solutions that the embodiments of the present disclosure have the following beneficial effects:

The embodiments of the present disclosure provide a wave loss detection circuit for a drive signal. In one aspect, when a first drive signal is at a high level, a first energy storage unit is charged by using a first resistor, and when the drive signal is at a low level, the first energy storage unit is discharged by using a second resistor. A resistance of the first resistor is less than a resistance of the second resistor; therefore, a charging speed of the first energy storage unit is made greater than a discharging speed of the first energy storage unit, and a voltage on the first energy storage unit (that is, a voltage at a first end of the first energy storage unit) is always greater than a threshold voltage. Therefore, if the voltage on the first energy storage unit is less than the threshold voltage, it indicates that a wave loss occurs in the first drive signal, and in this case, a comparison unit outputs a first voltage signal. Therefore, it can be determined, based on whether the comparison unit outputs the first voltage signal, whether a wave loss occurs in the first drive signal.

In another aspect, after a first drive signal and a second drive signal that are complementary to each other pass through a first OR gate, a high-level signal should be output. The high-level signal passes through a third resistor to charge a second energy storage unit, and in this case, a voltage on the second energy storage unit (that is, a voltage at a first end of the second energy storage unit) is at a high level. If there is dead zone impact, the second energy storage unit is in a discharging state within a dead time. However, the dead time is quite short; therefore, a discharging speed of the second energy storage unit is quite low, and the voltage on the second energy storage unit can still be kept at a high level, so that the dead zone impact is eliminated. Therefore, if the voltage on the second energy storage unit is at a low level, it indicates that it is not because of impact caused by a dead zone, but because of a wave loss occurring in at least one drive signal of the first drive signal and the second drive signal.

Reference throughout this specification to "one embodiment," "an embodiment." "exemplary embodiment." or the like in the singular or plural means that one or more particular features, structures, or characteristics described in connection with an embodiment is included in at least one embodiment of the present disclosure. Thus, the appearances of the phrases "in one embodiment" or "in an embodiment," "in an exemplary embodiment," or the like in the singular or plural in various places throughout this specification are not necessarily all referring to the same embodiment. Further- more, the particular features, structures, or characteristics in one or more embodiments may be combined in any suitable manner.

It may be learned that in the embodiments of the present disclosure, a drive signal passes through a resistor to charge or discharge an energy storage unit, and a charging speed is greater than a discharging speed. Therefore, if no wave loss occurs in the drive signal, it can be ensured that a voltage on the energy storage unit is always greater than a threshold or kept at a high level. Otherwise, it indicates that a wave loss occurs in the drive signal. Therefore, in the embodiments of the present disclosure, wave loss detection can be implemented by using basic components such as a resistor and an energy storage unit, and no sensor, which is at a relatively high price, is needed, so that costs are reduced.

A drive signal is generally transmitted to a control end of an electronic device by using a transmission line, and is used to drive the electronic device to work. However, because of a transmission line fault or the like, a wave loss phenomenon may occur in the drive signal, where the wave loss phenomenon refers to a case in which a waveform loss occurs because of a transmission exception or the like. If the wave loss phenomenon occurs, the drive signal cannot properly drive the electronic device, which causes a security threat. For example, when IGBTs connected in parallel are being driven by using two drive signals, if a wave loss phenomenon occurs in one of the drive signals, the IGBT driven by the other drive signal bears a higher current; therefore, it is very likely that the device is overstressed and fails.

To eliminate this security threat, in the prior art, an output signal of an electronic device is detected by using a sensor, so as to determine, according to whether the electronic device properly works, whether a wave loss phenomenon occurs in a drive signal. However, this manner of detection by using a sensor is cost-consuming.

In the embodiments of the present disclosure, a wave loss detection circuit for a drive signal and a switching transistor drive circuit are provided, so as to detect a wave loss phenomenon of a drive signal and reduce costs.

The following clearly describes the technical solutions in the embodiments of the present disclosure with reference to the accompanying drawings in the embodiments of the present disclosure. Apparently, the described embodiments are merely some but not all of the embodiments of the present disclosure. All other embodiments obtained by persons skilled in the art based on the embodiments of the present disclosure without creative efforts shall fall within the protection scope of the present disclosure.

Referring to FIG. 1, this embodiment of the present disclosure provides a first embodiment of a wave loss detection circuit for a drive signal. This embodiment specifically includes a diode D, a first resistor R1, a first energy storage unit C1, a second resistor R2, and a comparison unit U.

An anode of the diode D is configured to receive a first drive signal. In other words, the anode of the diode is an input end of the circuit in this embodiment. The first drive signal may be used to drive an electronic device such as a switching transistor, where the switching transistor refers to a device used to implement a switching function, such as a triode, a MOS transistor, or an IGBT. The first drive signal may further be a periodic drive signal.

A cathode of the diode D is connected to a first end of the first resistor R1.

A second end of the first resistor R1 is connected to a first end of the first energy storage unit C1, a first end of the second resistor R2, and a first input end of the comparison unit U.

In FIG. 1, that the first energy storage unit C1 is specifically a capacitor is used as an example. Actually, the first energy storage unit C1 may also be multiple capacitors connected in series or in parallel, or may be another energy storage device, which is not limited in this embodiment of the present disclosure.

A second end of the first energy storage unit C1 and a second end of the second resistor R2 are connected to a ground level.

A second input end of the comparison unit U is configured to receive a threshold voltage Vth. If a voltage signal Vin received by the first input end of the comparison unit U is less than the threshold voltage Vth, a voltage signal SO1 output by an output end of the comparison unit U is a first voltage signal, where the first voltage signal indicates that a wave loss occurs in the first drive signal. For example, when the first input end is specifically a positive input end of the comparison unit U, and the second input end is specifically a negative input end of the comparison unit U, if the voltage signal Vin received by the first input end is less than the threshold voltage Vth, the first voltage signal is a high-level signal.

In this embodiment, the threshold voltage Vth is a critical voltage used to determine whether a wave loss occurs in the first drive signal. Actually, the comparison unit converts a drive signal into a logic signal. Therefore, the threshold voltage Vth is specifically a critical voltage of the first drive signal at a high level Vih. That is, a voltage that is greater than the threshold voltage Vth is at a high level, and a voltage that is less than the threshold voltage Vth is at a low level. A PWM drive signal is used as an example, and a threshold voltage Vth may be 0.7 Vih-0.8 Vih. For example, if a high level Vih of the PWM drive signal is equal to 5 V, the threshold voltage Vth may be 5 V×0.7=3.5 V. Therefore, by comparing the voltage Vin on the first energy storage unit C1 with the threshold voltage, it can be determined whether the voltage Vin on the first energy storage unit C1 is at a high level or at a low level.

In this embodiment, the output end of the comparison unit U is an output end of the circuit in this embodiment. In addition, the comparison unit U may be a comparison circuit such as a comparator, provided that a voltage comparison function can be implemented.

A resistance of the first resistor R1 is less than a resistance of the second resistor R2, so that a charging speed of the first energy storage unit C1 is greater than a discharging speed of the first energy storage unit C1.

In this embodiment, the first drive signal may be any signal of a pulse width modulation (Pulse Width Modulation, PWM) drive signal, a triangular-wave drive signal, and a sine-wave drive signal. The following uses a PWM drive signal as an example to describe a working process of the circuit in this embodiment.

At an initial moment, the voltage on the first energy storage unit C1 is 0. When the PWM drive signal is at a high level (such as 5 V or 15 V), the diode D is on, and in this case, the PWM drive signal passes through the diode D and the first resistor R1 to charge the first energy storage unit C1. It may be learned that the first resistor R1 is a current-limiting resistor. When the PWM drive signal is at a low level, the diode D is off, and in this case, the first energy storage unit C1 is discharged by using the second resistor R2. It may be learned that the second resistor R2 is a discharging resistor, and is mainly used to keep discharging. Even a discharging process of the first energy storage unit C1 also belongs to a normal state of a drive signal instead of being considered as a wave loss phenomenon caused by a transmission exception. Therefore, in this embodiment, the resistance of the first resistor R1 is less than the resistance of the second resistor R2 to ensure that the charging speed of the first energy storage unit C1 is greater than the discharging speed of the first energy storage unit C1. Therefore, the voltage Vin on the first energy storage unit C is always greater than the threshold voltage Vth, provided that the PWM drive signal is in a normal state, that is, no wave loss occurs. For example, if the first input end is specifically a positive input end of the comparison unit U, and the second input end is specifically a negative input end of the comparison unit U, the first voltage signal is a high-level signal.

Figure 2:
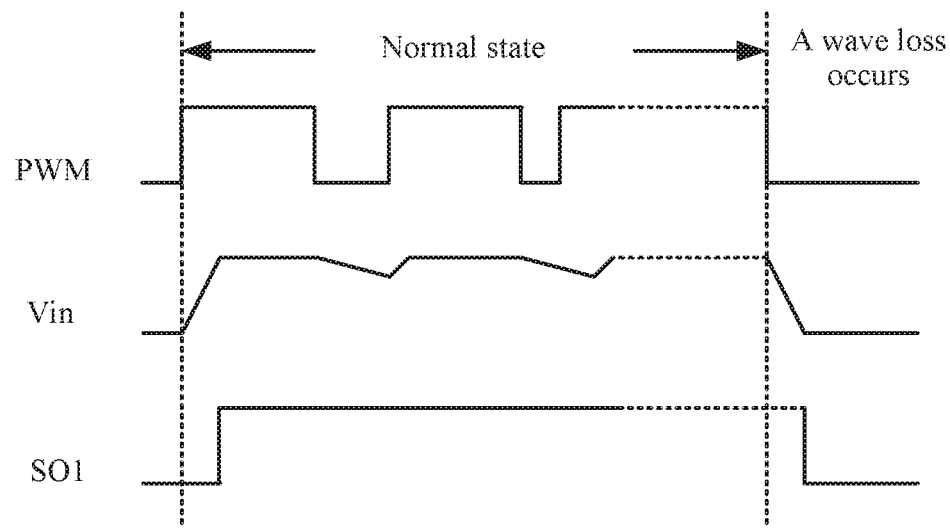
FIG. 2 is a sequence diagram of a circuit status of the circuit shown in FIG. 1.

It should be noted that as shown in FIG. 2, it takes some time to charge the first energy storage unit C1; therefore, the comparison unit U generally outputs a high-level signal only after the first drive signal is kept at a high level for some time. Correspondingly, the voltage signal SO1 output by the comparison unit U can be detected also after the first drive signal is kept at a high level for some time.

On the contrary, if a wave loss occurs in the PWM drive signal, the voltage Vin on the first energy storage unit C1 is less than the threshold voltage. In this case, if the first input end is specifically a positive input end of the comparison unit U, and the second input end is specifically a negative input end of the comparison unit U, the voltage signal SO1 output by the comparison unit U is a low-level signal. Likewise, it takes some time to discharge the first energy storage unit C1; therefore, the voltage signal SO1 is generally a low-level signal only after the first drive signal is kept at a low level for some time.

The foregoing describes a working case of the circuit in this embodiment when the first drive signal is a PWM drive signal. When the first drive signal is a drive signal of another type, a working case of the circuit in this embodiment is similar, and therefore details are not described again.

It may be learned from the foregoing technical solution that in this embodiment, when a first drive signal is at a high level, a first energy storage unit C1 is charged by using a first resistor R1, and when the first drive signal is at a low level, the first energy storage unit C1 is discharged by using a second resistor R2. A resistance of the first resistor R1 is less than a resistance of the second resistor R2; therefore, a charging speed of the first energy storage unit C is greater than a discharging speed of the first energy storage unit C1, and a voltage on the first energy storage unit C1 (that is, a voltage at a first end of the first energy storage unit C1) is always greater than a threshold voltage Vth. Therefore, if the voltage on the first energy storage unit C1 is less than the threshold voltage, it indicates that a wave loss occurs in the first drive signal, and in this case, a comparison unit U outputs a first voltage signal. Therefore, it can be determined, depending on whether the comparison unit U outputs the first voltage signal, whether a wave loss occurs in the first drive signal.

It may be learned that in this embodiment of the present disclosure, a drive signal passes through a resistor to charge or discharge an energy storage unit, and a charging speed is greater than a discharging speed. Therefore, if no wave loss occurs in the drive signal, it can be ensured that a voltage on the energy storage unit is always greater than a threshold or kept at a high level. Otherwise, it indicates that a wave loss occurs in the drive signal. Therefore, in this embodiment of the present disclosure, wave loss detection can be implemented by using basic components such as a resistor and an energy storage unit without using a high-priced sensor, thereby reducing costs.

In this embodiment, when determining that the voltage signal Vin received by the first input end is less than the threshold voltage Vth, the comparison unit U outputs the first voltage signal. When determining that the voltage signal Vin received by the first input end is greater than the threshold voltage Vth, the comparison unit U may output a second voltage signal. Apparently, the second voltage signal indicates that no wave loss occurs in the first drive signal.

In this embodiment, the resistance of the first resistor R1 is less than the resistance of the second resistor R2, and therefore it can be ensured that the charging speed of the first energy storage unit C1 is greater than the discharging speed of the first energy storage unit C1. A deduction process is specifically described below.

FIG. 2 is still used as an example for description. At an initial moment, the voltage on the first energy storage unit C1 is 0, when the PWM drive signal is at a high level, the PWM drive signal passes through the diode D and the first resistor R1 to charge the first energy storage unit C1, and in this case, Charging time constant t1=Resistance of R1×Capacitance of C1. When the PWM drive signal is at a low level, the first energy storage unit C1 is discharged by using the second resistor R2, and in this case, Discharging time constant t2=Resistance of R2× Capacitance of C1.

If it needs to be ensured that the charging speed of the first energy storage unit C is greater than the discharging speed of the first energy storage unit C1, the charging time constant t1 needs to be less than the discharging time constant t2; therefore, the resistance of the first resistor R1 is less than the resistance of the second resistor R2. To reduce impact of discharging on the voltage, it is recommended that the resistance of the first resistor R1 is far less than the resistance of the second resistor R2. For example, the resistance of the second resistor R2 is at least 5000 times higher than the resistance of the first resistor R1. For example, this case is illustrated in the following example.

It is assumed that a frequency of the PWM drive signal is 100 kHz, a time period is 10 µs, the capacitance of the first energy storage unit C1 is equal to 1 µF, and the resistance of the first resistor R1 is equal to 10Ω. In this case, the charging time constant t1 is equal to 10 µs, and the discharging time constant t2 may be far greater than 10 µs. Preferentially, t2 is greater than 50 ms, and it may be learned that R2 is greater than 50 kΩ. Actually, R2 may be 100 kΩ or higher. In this case, the charging speed is at least 5000 times higher than or even 10,000 times higher than the discharging speed. When charging or discharging is being performed, impact of discharging on the voltage almost does not need to be considered.

In this embodiment, theoretically, it is recommended that the resistance of the first resistor R1 is small. However, it may be preferred that the resistance of the first resistor is greater than a resistance of a threshold resistor. When the resistance of the first resistor R1 is equal to the resistance of the threshold resistor, an inrush current passing through the first energy storage unit C1 is equal to a maximum allowable inrush current of the first energy storage unit C1. Therefore, if the resistance of the first resistor is less than the resistance of the threshold resistor, the inrush current passing through the first energy storage unit C1 is greater than the maximum allowable inrush current, and the first energy storage unit C1 may be damaged. The foregoing PWM drive signal whose frequency is 100 kHz is still used as an example for description. More than three switching periods may be required for the voltage on the first energy storage unit C1 to rush to a high level (such as 5 V or 15 V). When the high level of the PWM drive signal is 5 V, Resistance of the threshold resistor=High level of the PWM drive signal/Maximum allowable inrush current=5 V/0.5 A=10Ω. Therefore, the resistance of the first resistor R1 needs to be greater than 10Ω.

Figure 3:
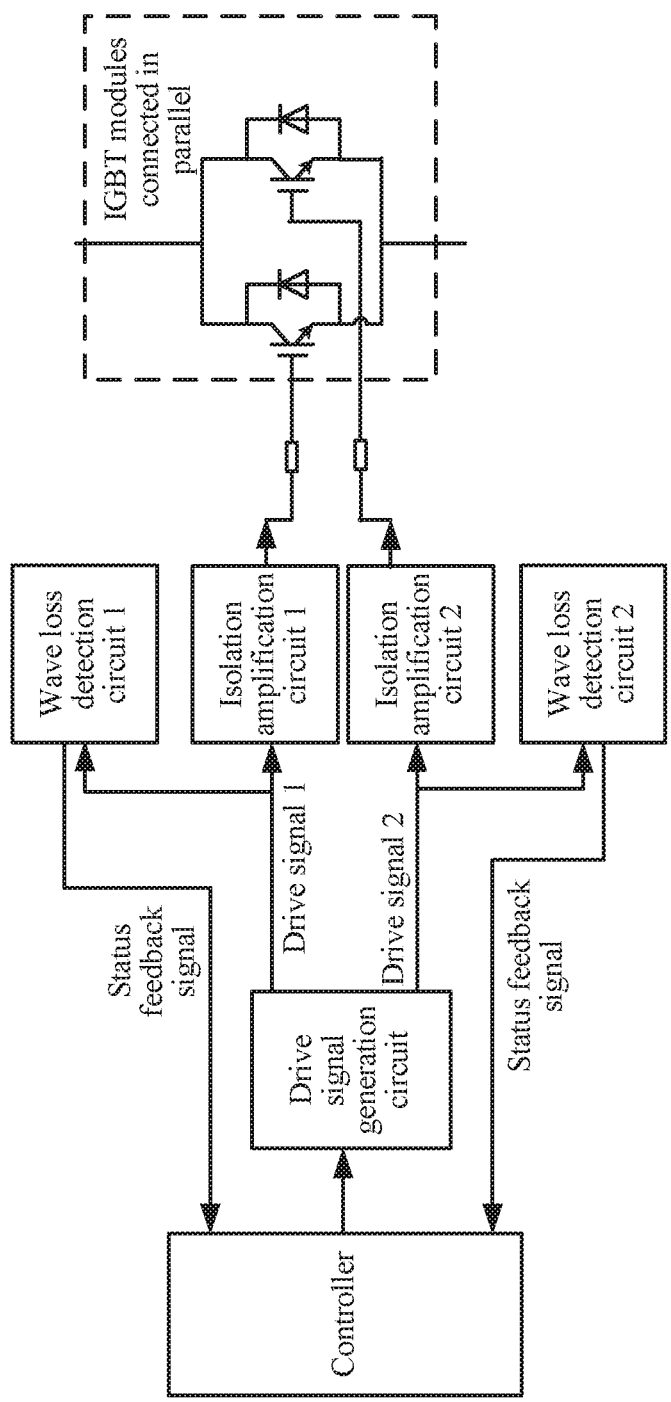
FIG. 3 is a schematic diagram of a structure of the circuit shown in FIG. 1 when the circuit is used to detect wave loss cases of drive signals connected in parallel.

Currently, in the prior art, wave loss detection on drive signals connected in parallel is often neglected. Therefore, the circuit in this embodiment is especially applicable to detection on any drive signal in multiple drive signals connected in parallel. For example, as shown in FIG. 3, wave loss cases of a drive signal 1 and a drive signal 2 are respectively detected by using a wave loss detection circuit 1 and a wave loss detection circuit 2 provided in this embodiment of the present disclosure. The following provides a specific description.

In FIG. 3, a controller outputs, by using a drive signal generation circuit, the drive signal 1 and the drive signal 2 that are connected in parallel. The drive signal 1 is divided into two signals, where after passing through an isolation amplification circuit 1, one signal is output to an IGBT in IGBT modules connected in parallel; the other signal is output to the wave loss detection circuit 1, the wave loss detection circuit 1 feeds back, to the controller, a status feedback signal output by a comparison unit, and the controller determines, according to the status feedback signal, whether a wave loss occurs in the drive signal 1. An output case of the drive signal 2 is similar, and details are not described herein again.

Complementary drive circuits are common drive circuits in a power electronics topology. There are two or more complementary drive signals in complementary drive circuits. However, in the prior art, for complementary drive circuits, there is no wave loss detection manner exclusively for complementary drive signals; instead, wave loss detection on each of the complementary drive signals is still performed by a sensor. Apparently, costs are relatively high.

Actually, the wave loss detection circuit provided in this embodiment may be specifically used in a switching transistor drive circuit, and in this case, the switching transistor drive circuit includes the wave loss detection circuit in this embodiment, a first drive signal generation circuit, a first controller, and a switching transistor.

An output end of the first drive signal generation circuit is connected to the input end of the wave loss detection circuit in this embodiment (that is, the anode of the diode D) and a control end of the switching transistor, and is configured to output the first drive signal to the anode of the diode D and the control end of the switching transistor. The control end of the switching transistor refers to an input end used to control an on state of the switching transistor.

An input end of the first controller is connected to the output end of the wave loss detection circuit in this embodiment (that is, the output end of the comparison unit U), and an output end of the first controller is connected to an input end of the first drive signal generation circuit.

When the first controller detects that the output end of the wave loss detection circuit in this embodiment (that is, the output end of the comparison unit U) does not output the first voltage signal, it indicates that no wave loss phenomenon occurs in the first drive signal, and in this case, the first controller controls the first drive signal generation circuit to generate and output the first drive signal, so as to drive the switching transistor.

When the first controller detects that the output end of the wave loss detection circuit in this embodiment outputs the first voltage signal, it indicates that a wave loss phenomenon occurs in the first drive signal. Either of the following two manners may be used to prevent the switching transistor from being damaged.

Manner 1: The first controller controls the first drive signal generation circuit to stop generating and outputting the first drive signal, so as to stop driving the switching transistor.

Manner 2: The first controller controls the first drive signal generation circuit to generate and output a second drive signal, so that the switching transistor is driven, and a current that passes through the switching transistor does not exceed a maximum current allowed by the switching transistor to pass through, where a pulse width of the second drive signal is less than a pulse width of the first drive signal.

It should be noted that in the switching transistor drive circuit, the first controller may be an electronic device that has a control function, such as a single-chip microcomputer, an ARM, a DSP, or an FPGA. The first drive signal generation circuit may be built into the first controller, and be specifically a function module in the first controller.

The switching transistor drive circuit may be disposed in a device that needs a drive signal, such as an inverter or a power module.

In the embodiments of the present disclosure, a wave loss detection circuit for a drive signal is further provided exclusively for wave loss detection on two or more complementary drive signals, which is specifically described in the following embodiment.

Figure 4:
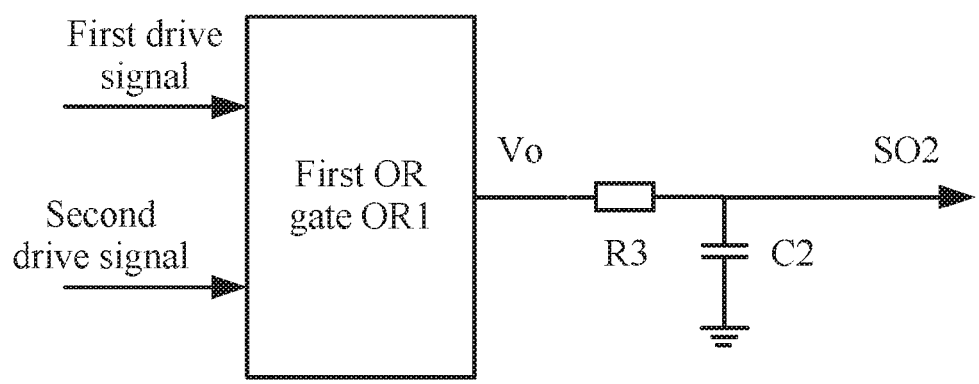
FIG. 4 is a specific circuit diagram of a second embodiment of a wave loss detection circuit according to an embodiment of the present disclosure.

Referring to FIG. 4, this embodiment of the present disclosure further provides a second embodiment of a wave loss detection circuit for a drive signal. This embodiment includes a first OR gate OR1, a third resistor R3, and a second energy storage unit C2.

Two input ends of the first OR gate OR1 are respectively configured to receive a first drive signal and a second drive signal that are complementary to each other.

An output end of the first OR gate OR1 is connected to a first end of the third resistor R3, and a second end of the third resistor R3 is connected to a first end of the second energy storage unit C2.

In an example of FIG. 4, the second energy storage unit C2 is specifically a capacitor. Actually, the second energy storage unit C2 may also be multiple capacitors connected in series or in parallel, or may be another energy storage device, which is not limited in this embodiment of the present disclosure.

A second end of the second energy storage unit C2 is connected to a ground level.

If the first end of the second energy storage unit C2 outputs a low-level signal, it indicates that a wave loss occurs in at least one drive signal of the first drive signal and the second drive signal.

In this embodiment, each of the first drive signal and the second drive signal that are complementary to each other may be any signal of a PWM drive signal, a triangular-wave drive signal, and a sine-wave drive signal. The following describes a working principle of the circuit in this embodiment by using PWM drive signals as an example.

Figure 5:
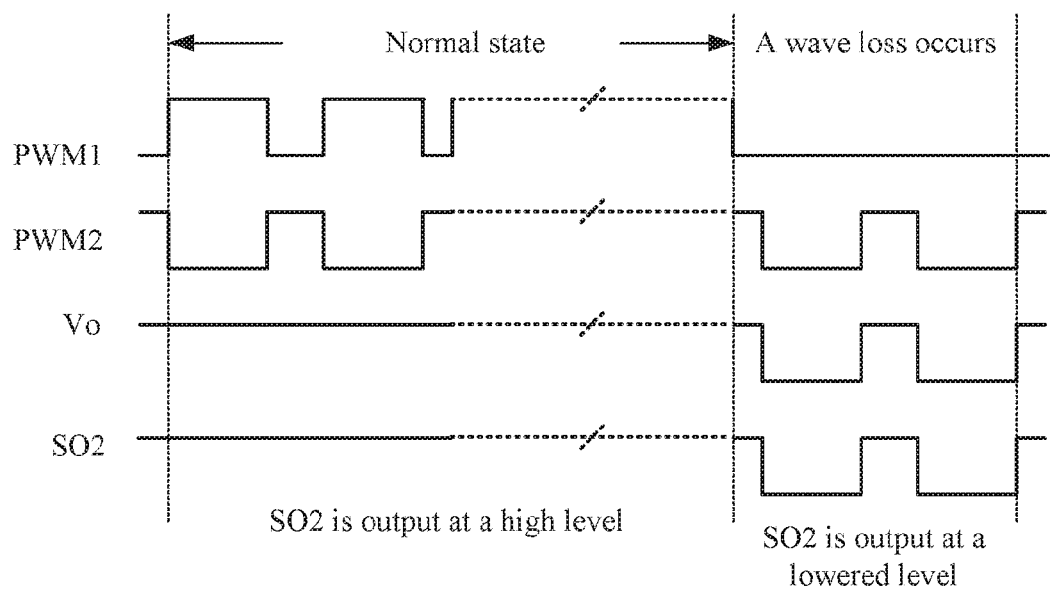
FIG. 5 is a sequence diagram of a circuit status of the circuit shown in FIG. 4.

After complementary drive signals PWM1 and PWM2 in FIG. 5 pass through the OR gate OR1, an output signal Vo should be at a high level because the two drive signals are complementary to each other. The output signal Vo passes through the third resistor R3 to charge the second energy storage unit C2, and in this case, an output signal SO2 of the entire circuit may also be at a high level. When either of or both of two signals are lowered because of an exception, the output signal Vo is also lowered. In this case, the output signal SO2 is also lowered. Therefore, it may be determined, according to a level status of the output signal SO2, whether an exception occurs in the two complementary drive signals.

Figure 6:
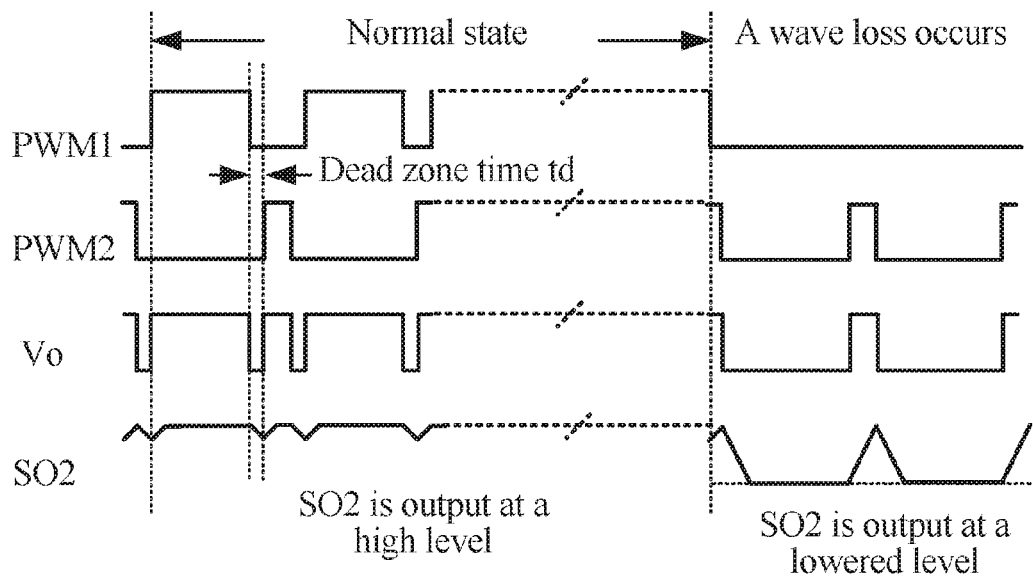
FIG. 6 is a sequence diagram of a circuit status of the circuit shown in FIG. 4 when a dead zone is generated.

Actually, it is very likely that the complementary drive signals are affected by a dead zone. For example, as shown in FIG. 6, within a dead time td, the two drive signals are not in a complementary state. Therefore, within the dead time td, the output signal Vo is lowered, and the second energy storage unit C2 is in a discharging state. However, generally, the dead time is relatively short; therefore, after the output signal Vo passes through a charging circuit that includes the second energy storage unit C2 and the third resistor R3, the output signal SO2 is still at a high level, so that dead zone impact is eliminated.

The foregoing describes a working case of the circuit in this embodiment when the first drive signal and the second drive signal are PWM drive signals. When the first drive signal and the second drive signal are drive signals of another type, a working case of the circuit in this embodiment is similar, and therefore details are not described again.

Both the first drive signal and the second drive signal may be used to drive a switching transistor.

It may be learned from the foregoing technical solution that in this embodiment, after a first drive signal and a second drive signal that are complementary to each other pass through a first OR gate OR1, a high-level signal should be output. The high-level signal passes through a third resistor R3 to charge a second energy storage unit C2, and in this case, a voltage on the second energy storage unit C2 (that is, a voltage at a first end of the second energy storage unit C2) is at a high level. If there is dead zone impact, the second energy storage unit C2 is in a discharging state within a dead time. However, the dead time is quite short; therefore, a discharging speed of the second energy storage unit C2 is quite low, and the voltage on the second energy storage unit C2 can still be kept at a high level, so that the dead zone impact is eliminated. However, if a wave loss occurs in either drive signal in the first drive signal and the second drive signal, the first OR gate OR1 keeps outputting a low-level signal, and the second energy storage unit C2 cannot be charged; therefore, the voltage on the second energy storage unit is at a low level. That is, if the voltage on the second energy storage unit is at a low level, it indicates that it is not because of impact caused by a dead zone, but because of a wave loss occurring in at least one drive signal of the first drive signal and the second drive signal.

It may be learned that in this embodiment of the present disclosure, a drive signal passes through a resistor to charge or discharge an energy storage unit, and a charging speed is greater than a discharging speed. Therefore, if no wave loss occurs in the drive signal, it can be ensured that a voltage on the energy storage unit is always greater than a threshold or kept at a high level. Otherwise, it indicates that a wave loss occurs in the drive signal. Therefore, in this embodiment of the present disclosure, wave loss detection can be implemented by using basic components such as a resistor and an energy storage unit, and no sensor, which is at a relatively high price, is needed, so that costs are reduced.

It should be noted that a difference between this embodiment and the first embodiment is: in the first embodiment, after a first drive signal passes through a first energy storage unit, and the first energy storage unit is charged or discharged, a voltage imposed on the first energy storage unit is an analog signal, and therefore needs to be converted by a comparison unit into a digital logic signal for detection; in this embodiment, a voltage on a second energy storage unit is still a digital logic signal, and therefore does not need to be converted by a comparison unit.

Actually, the wave loss detection circuit provided in this embodiment may be specifically used in a switching transistor drive circuit, and in this case, the switching transistor drive circuit includes the wave loss detection circuit in this embodiment, a second drive signal generation circuit, a second controller, and two switching transistors.

Two output ends of the second drive signal generation circuit are connected to two input ends of the wave loss detection circuit in this embodiment (that is, the two input ends of the first OR gate OR1) and control ends of the two switching transistors, and are configured to: respectively output the first drive signal and the second drive signal to the two input ends of the first OR gate OR1, and respectively output the first drive signal and the second drive signal to the control ends of the two switching transistors.

An input end of the second controller is connected to an output end of the wave loss detection circuit in this embodiment (that is, the first end of the second energy storage unit C2), and an output end of the second controller is connected to an input end of the second drive signal generation circuit.

When the second controller detects that the output end of the wave loss detection circuit in this embodiment (that is, the first end of the second energy storage unit C2) outputs a high-level signal, it indicates that a wave loss phenomenon does not occur in the first drive signal or the second drive signal, and in this case, the second controller controls the second drive signal generation circuit to generate and output the first drive signal and the second drive signal, so as to drive the two switching transistors.

When the second controller detects that the output end of the wave loss detection circuit in this embodiment (that is, the first end of the second energy storage unit C2) outputs a low-level signal, it indicates that a wave loss phenomenon occurs in at least one drive signal of the first drive signal and the second drive signal. Either of the following two manners may be used to prevent the two switching transistors from being damaged.

Manner 1: The second controller controls the second drive signal generation circuit to stop generating and outputting the first drive signal and the second drive signal, so as to stop driving the two switching transistors.

Manner 2: The second controller controls the second drive signal generation circuit to generate and output a fifth drive signal and a sixth drive signal, so that the two switching transistors are respectively driven, and currents that pass through the two switching transistors do not exceed maximum currents allowed by the two switching transistors to pass through.

A pulse width of the fifth drive signal is less than a pulse width of the first drive signal, and the fifth drive signal and the first drive signal are corresponding to driving of a same switching transistor. For example, the two switching transistors are specifically a switching transistor Q1 and a switching transistor Q2, and both the first drive signal and the fifth drive signal are used to drive the switching transistor Q1. A pulse width of the sixth drive signal is less than a pulse width of the second drive signal, and the sixth drive signal and the second drive signal are corresponding to driving of a same switching transistor. The foregoing example is still used for description, and both the sixth drive signal and the second drive signal are used to drive the switching transistor Q2. It should be noted that in the switching transistor drive circuit, the second controller may be an electronic device that has a control function, such as a single-chip microcomputer, an ARM, a DSP, or an FPGA. The second drive signal generation circuit may be built into the second controller, and be specifically a function module in the second controller.

The switching transistor drive circuit may be disposed in a device that needs a drive signal, such as an inverter or a power module.

The foregoing describes wave loss detection on two (a pair of) complementary drive signals. In the embodiments of the present disclosure, wave loss detection may be further performed on multiple pairs of complementary drive signals, which is specifically described in the following embodiment.

Figure 7:
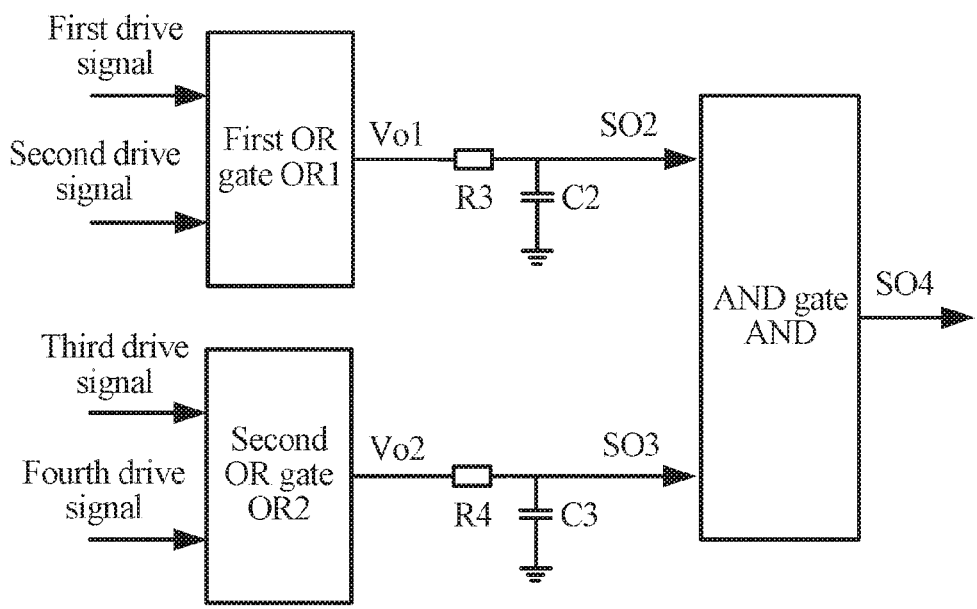
FIG. 7 is a specific circuit diagram of a third embodiment of a wave loss detection circuit according to an embodiment of the present disclosure.

Referring to FIG. 7, this embodiment of the present disclosure further provides a third embodiment of a wave loss detection circuit for a drive signal. This embodiment includes a first OR gate OR1, a second OR gate OR2, a third resistor R3, a fourth resistor R4, a second energy storage unit C2, a third energy storage unit C3, and an AND gate AND.

Two input ends of the first OR gate OR1 are respectively configured to receive a first drive signal and a second drive signal that are complementary to each other.

An output end of the first OR gate OR1 is connected to a first end of the third resistor R3, and a second end of the third resistor R3 is connected to a first end of the second energy storage unit C2.

In an example of FIG. 7, the second energy storage unit C2 is specifically a capacitor. Actually, the second energy storage unit C2 may also be multiple capacitors connected in series or in parallel, or may be another energy storage device, which is not limited in this embodiment of the present disclosure.

A second end of the second energy storage unit C2 is connected to a ground level.

Two input ends of the second OR gate OR2 are respectively configured to receive a third drive signal and a fourth drive signal that are complementary to each other.

An output end of the second OR gate OR2 is connected to a first end of the fourth resistor R4, and a second end of the fourth resistor R4 is connected to a first end of the third energy storage unit C3.

In an example of FIG. 7, the third energy storage unit C3 is specifically a capacitor. Actually, the third energy storage unit C3 may also be multiple capacitors connected in series or in parallel, or may be another energy storage device, which is not limited in this embodiment of the present disclosure.

A second end of the third energy storage unit C3 is connected to the ground level.

The second end of the third resistor R3 and the second end of the fourth resistor R4 are respectively connected to two input ends of the AND gate AND.

If an output end of the AND gate AND outputs a low-level signal, it indicates that a wave loss occurs in at least one drive signal of the first drive signal, the second drive signal, the third drive signal, and the fourth drive signal.

The first drive signal, the second drive signal, the third drive signal, and the fourth drive signal may be all used to drive a switching transistor.

In this embodiment, after the first drive signal and the second drive signal that are complementary to each other pass through the first OR gate OR1, an output signal should be at a high level; therefore, a voltage SO2 on the second energy storage unit C2 is also at a high level. Likewise, a voltage SO3 on the third energy storage unit C3 is also at a high level. After the voltage SO2 and the voltage SO3 pass through the AND gate AND, an output voltage SO4 of the AND gate is also at a high level. Even if there is dead zone impact, because a dead time is quite short, a level status finally outputted is not affected. However, if a wave loss occurs in any drive signal in the four drive signals, the AND gate AND outputs a low-level signal.

Actually, the wave loss detection circuit provided in this embodiment may be specifically used in a switching transistor drive circuit, and in this case, the switching transistor drive circuit includes the wave loss detection circuit in this embodiment, a third drive signal generation circuit, a third controller, and four switching transistors.

Four output ends of the third drive signal generation circuit are connected to four input ends of the wave loss detection circuit in this embodiment (that is, the two input ends of the first OR gate OR1 and the two input ends of the second OR gate OR2) and control ends of the four switching transistors, and are configured to: respectively output the first drive signal, the second drive signal, the third drive signal, and the fourth drive signal to the two input ends of the first OR gate OR1 and the two input ends of the second OR gate OR2, and respectively output the first drive signal, the second drive signal, the third drive signal, and the fourth drive signal to the control ends of the four switching transistors.

An input end of the third controller is connected to an output end of the wave loss detection circuit in this embodiment (that is, the output end of the AND gate AND), and an output end of the third controller is connected to an input end of the third drive signal generation circuit.

When the third controller detects that the output end of the wave loss detection circuit in this embodiment (that is, the output end of the AND gate AND) outputs a high-level signal, it indicates that a wave loss phenomenon does not occur in the first drive signal, the second drive signal, the third drive signal, or the fourth drive signal, and in this case, the third controller controls the third drive signal generation circuit to generate and output the first drive signal, the second drive signal, the third drive signal, and the fourth drive signal, so as to drive the four switching transistors.

When the third controller detects that the output end of the wave loss detection circuit in this embodiment (that is, the output end of the AND gate AND) outputs a low-level signal, it indicates that a wave loss phenomenon occurs in at least one drive signal of the first drive signal, the second drive signal, the third drive signal, and the fourth drive signal. Either of the following two manners may be used to prevent the four switching transistors from being damaged.

Manner 1: The third controller controls the third drive signal generation circuit to stop generating and outputting the first drive signal, the second drive signal, the third drive signal, and the fourth drive signal, so as to stop driving the four switching transistors.

Manner 2: The third controller controls the third drive signal generation circuit to generate and output a fifth drive signal, a sixth drive signal, a seventh drive signal, and an eighth drive signal, so that the four switching transistors are respectively driven, and currents that pass through the four switching transistors do not exceed maximum currents allowed by the four switching transistors to pass through.

A pulse width of the fifth drive signal is less than a pulse width of the first drive signal, and the fifth drive signal and the first drive signal are corresponding to driving of a same switching transistor, a pulse width of the sixth drive signal is less than a pulse width of the second drive signal, and the sixth drive signal and the second drive signal are corresponding to driving of a same switching transistor; a pulse width of the seventh drive signal is less than a pulse width of the third drive signal, and the seventh drive signal and the third drive signal are corresponding to driving of a same switching transistor; a pulse width of the eighth drive signal is less than a pulse width of the fourth drive signal, and the eighth drive signal and the fourth drive signal are corresponding to driving of a same switching transistor. For example, the four switching transistors are specifically a switching transistor Q1, a switching transistor Q2, a switching transistor Q2, a switching transistor Q3, and a switching transistor Q4. In this case, both the first drive signal and the fifth drive signal may be used to drive the switching transistor Q1; both the sixth drive signal and the second drive signal may be used to drive the switching transistor Q2; both the seventh drive signal and the third drive signal may be used to drive the switching transistor Q3; both the eighth drive signal and the fourth drive signal may be used to drive the switching transistor Q4.

It should be noted that in the switching transistor drive circuit, the third controller may be an electronic device that has a control function, such as a single-chip microcomputer, an ARM, a DSP, or an FPGA. The third drive signal generation circuit may be built into the third controller, and be specifically a function module in the third controller.

The switching transistor drive circuit may be disposed in a device that needs a drive signal, such as an inverter or a power module.

In the second and the third embodiments of a wave loss detection circuit, only whether there is a drive signal in which a wave loss occurs can be detected; however, whether there is one or more drive signals in which a wave loss occurs, and which specific drive signal in which a wave loss occurs still cannot be determined. Therefore, the wave loss detection circuit in the first embodiment may further perform wave loss detection on any one or more drive signals, for example, perform wave loss detection on a first drive signal in the second embodiment or the third embodiment. For details, refer to the following embodiment.

This embodiment of the present disclosure provides a fourth embodiment of a wave loss detection circuit for a drive signal. As shown in FIG. 1 and FIG. 4, this embodiment specifically includes a diode D, a first resistor R1, a first energy storage unit C1, a second resistor R2, a comparison unit U, a first OR gate OR1, a third resistor R3, and a second energy storage unit C2.

An anode of the diode D is configured to receive a first drive signal. A cathode of the diode D is connected to a first end of the first resistor R1.

A second end of the first resistor R1 is connected to a first end of the first energy storage unit C1, a first end of the second resistor R2, and a first input end of the comparison unit U.

A second end of the first energy storage unit C1 and a second end of the second resistor R2 are connected to a ground level.

A second input end of the comparison unit U is configured to receive a threshold voltage Vth, and if a voltage signal Vin received by the first input end of the comparison unit U is less than the threshold voltage Vth, a voltage signal SO1 output by an output end of the comparison unit U is a first voltage signal, where the first voltage signal indicates that a wave loss occurs in the first drive signal. The threshold voltage Vth is specifically a critical voltage of the first drive signal at a high level Vih.

A resistance of the first resistor R1 is less than a resistance of the second resistor R2, so that a charging speed of the first energy storage unit C1 is greater than a discharging speed of the first energy storage unit C1.

Two input ends of the first OR gate OR1 are respectively configured to receive the first drive signal and a second drive signal that are complementary to each other.

An output end of the first OR gate OR1 is connected to a first end of the third resistor R3, and a second end of the third resistor R3 is connected to a first end of the second energy storage unit C2.

A second end of the second energy storage unit C2 is connected to the ground level.

The first end of the second energy storage unit C2 is an output end of the circuit in this embodiment. If the output end outputs a low-level signal, it indicates that a wave loss occurs in at least one drive signal of the first drive signal and the second drive signal.

In this embodiment, the first embodiment and the second embodiment of a wave loss detection circuit provided in the embodiments of the present disclosure are included, and whole wave loss detection on complementary drive signals and wave loss detection on one of the drive signals can be implemented. For specific details, refer to related content in the two embodiments, and specific descriptions are not provided in this embodiment.

The embodiments of the present disclosure are not only applicable to an application occasion for a single drive signal, such as the first embodiment of a wave loss detection circuit provided in the embodiments of the present disclosure, but also applicable to an application occasion for complementary drive signals required in a half-bridge circuit, a full-bridge circuit, or the like, such as the second and the third embodiments of a wave loss detection circuit provided in the embodiments of the present disclosure. In addition, the embodiments of the present disclosure may be used to a single-transistor application, or may be used to a double-level or multi-level converter.

It may be clearly understood by persons skilled in the art that, for the purpose of convenient and brief description, for a detailed working process of the foregoing system, apparatus, and unit, reference may be made to a corresponding process in the foregoing method embodiments, and details are not described herein again.

In the one or more embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, multiple units or assemblies may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on multiple network units. Some or all of the units may be selected according to actual needs to achieve the objectives of the solutions of the embodiments.

In addition, function units in the embodiments of the present disclosure may be integrated into one processing unit, or each of the units may exist alone physically, or two or more units are integrated into one unit. The integrated unit may be implemented in a form of hardware, or may be implemented in a form of a software function unit.

When the integrated unit is implemented in the form of a software function unit and sold or used as an independent product, the integrated unit may be stored in a computer-readable storage medium. Based on such an understanding, the technical solutions of the present disclosure essentially, or the part contributing to the prior art, or all or some of the technical solutions may be implemented in the form of a software product. The software product is stored in a storage medium and includes several instructions for instructing a computer device (which may be a personal computer, a server, or a network device) to perform all or some of the steps of the methods described in the embodiments of the present disclosure. The foregoing storage medium includes; any medium that can store program code, such as a USB flash drive, a removable hard disk, a read-only memory (ROM, Read-Only Memory), a random access memory (RAM, Random Access Memory), a magnetic disk, or an optical disc.

The foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present disclosure.

What is claimed is:

1. A drive circuit, comprising:
a wave loss detection circuit;
a first drive signal generation circuit;
a first controller; and
a switching transistor,
the wave loss detection circuit comprising:
a diode, a first resistor, a first energy storage device, a second resistor, and a comparison device;
an anode of the diode is configured to receive a first drive signal;
a cathode of the diode is coupled to a first end of the first resistor;
a second end of the first resistor is coupled to a first end of the first energy storage device, a first end of the second resistor, and a first input end of the comparison device;
a second end of the first energy storage device and a second end of the second resistor are coupled to a ground level;
a first resistance of the first resistor is less than a second resistance of the second resistor; and
a second input end of the comparison device is configured to receive a threshold voltage, and when a voltage received by the first input end is less than the threshold voltage, an output end of the comparison device outputs a first voltage signal, the first voltage signal indicating that a wave loss occurs in the first drive signal, and the threshold voltage being a critical voltage of the first drive signal at a high level;
an output end of the first drive signal generation circuit is coupled to an input end of the wave loss detection circuit and a control end of the switching transistor, and the output end of the first drive signal generation circuit is configured to output a first drive signal to an anode of the diode and the control end of the switching transistor;

an input end of the first controller is coupled to an output end of the wave loss detection circuit, and an output end of the first controller is coupled to an input end of the first drive signal generation circuit; and the first controller controls the first drive signal generation circuit to generate and output the first drive signal to drive the switching transistor when detecting that the output end of the wave loss detection circuit does not output the first voltage signal.

2. The drive circuit of claim 1, wherein when detecting that the output end of the wave loss detection circuit outputs the first voltage signal, the first controller controls the first drive signal generation circuit to stop generating and outputting the first drive signal.

3. The drive circuit of claim 1, wherein when detecting that the output end of the wave loss detection circuit outputs the first voltage signal, the first controller controls the first drive signal generation circuit to generate and output a second drive signal, a pulse width of the second drive signal is less than a pulse width of the first drive signal.

* * * * *